(12) United States Patent
Nakamura et al.

(10) Patent No.: US 10,425,060 B2
(45) Date of Patent: Sep. 24, 2019

(54) ACOUSTIC WAVE DEVICE AND METHOD OF FABRICATING THE SAME

(71) Applicant: TAIYO YUDEN CO., LTD., Tokyo (JP)

(72) Inventors: Kentaro Nakamura, Tokyo (JP); Fumiya Matsukura, Tokyo (JP); Takashi Matsuda, Tokyo (JP); Tsutomu Miyashita, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 15 days.

(21) Appl. No.: 15/331,598

(22) Filed: Oct. 21, 2016

(65) Prior Publication Data

US 2017/0201232 A1    Jul. 13, 2017

(30) Foreign Application Priority Data

Jan. 7, 2016    (JP) .................. 2016-002013

(51) Int. Cl.
*H03H 9/25* (2006.01)
*H03H 3/08* (2006.01)
*H03H 9/02* (2006.01)
*H03H 9/64* (2006.01)
*H03H 9/145* (2006.01)

(52) U.S. Cl.
CPC ............ *H03H 9/25* (2013.01); *H03H 3/08* (2013.01); *H03H 9/02559* (2013.01); *H03H 9/02834* (2013.01); *H03H 9/1452* (2013.01); *H03H 9/14541* (2013.01); *H03H 9/64* (2013.01)

(58) Field of Classification Search
CPC .................................. H03H 9/25; H03H 3/08
USPC ........................................................... 333/195
See application file for complete search history.

(56) References Cited

U.S. PATENT DOCUMENTS

| | | | |
|---|---|---|---|
| 6,297,580 B1 | 10/2001 | Takayama et al. | |
| 2003/0122453 A1 | 7/2003 | Yamada et al. | |
| 2004/0256950 A1* | 12/2004 | Hada ..................... | H03H 9/009 310/313 B |
| 2005/0127794 A1 | 6/2005 | Ozaki et al. | |
| 2007/0075606 A1 | 4/2007 | Inoue et al. | |

(Continued)

FOREIGN PATENT DOCUMENTS

EP    1 253 712 A1    10/2002
JP    2005-146152 A    6/2005

(Continued)

OTHER PUBLICATIONS

Japanese Office Action dated Apr. 17, 2018, in a counterpart Japanese patent application No. 2016-002013. (A machine translation (not reviewed for accuracy) attached.).

(Continued)

*Primary Examiner* — Stephen E. Jones
*Assistant Examiner* — Samuel S Outten
(74) *Attorney, Agent, or Firm* — Chen Yoshimura LLP

(57) ABSTRACT

An acoustic wave device includes: a piezoelectric substrate; a comb-shaped electrode that is located on the piezoelectric substrate and excites an acoustic wave; and a silicon oxide film that is located on the piezoelectric substrate so as to cover the comb-shaped electrode, and has a total concentration of carbon (C), hydrogen (H), nitrogen (N), and fluorine (F) equal to or less than 3.5 atomic %.

10 Claims, 14 Drawing Sheets

(56) References Cited

U.S. PATENT DOCUMENTS

| | | |
|---|---|---|
| 2007/0241840 A1 | 10/2007 | Takayama et al. |
| 2008/0309192 A1 | 12/2008 | Nakao et al. |
| 2009/0170345 A1 | 7/2009 | Akae et al. |
| 2012/0126376 A1 | 5/2012 | Honda et al. |
| 2013/0049533 A1 | 2/2013 | Matsuda et al. |
| 2016/0065176 A1 | 3/2016 | Taniguchi et al. |

FOREIGN PATENT DOCUMENTS

| | | |
|---|---|---|
| JP | 2009-201168 A | 9/2009 |
| JP | 2011-135245 A | 7/2011 |
| JP | 2012-149310 A | 8/2012 |
| JP | 2013-055371 A | 3/2013 |
| KR | 2002-0074484 A | 9/2002 |
| KR | 2007-0038005 A | 4/2007 |
| KR | 2011-0120859 A | 11/2011 |
| KR | 2015-0144797 A | 12/2015 |
| WO | 99/54995 A1 | 10/1999 |
| WO | 02/082645 A1 | 10/2002 |
| WO | 2007/108269 A1 | 9/2007 |
| WO | 2010/038887 A1 | 4/2010 |

OTHER PUBLICATIONS

Korean Office Action dated Jan. 17, 2018, in a counterpart Korean patent application No. 10-2016-0181016. (A machine translation (not reviewed for accuracy) attached.).

Korean Office Action dated Aug. 6, 2018, in a counterpart Korean patent application No. 10-2016-0181016.

Japanese Office Action dated Jul. 3, 2018, in a counterpart Japanese patent application No. 2016-002013. (A machine translation (not reviewed for accuracy) attached.).

Korean Office Action dated Sep. 18, 2018, in a counterpart Korean patent application No. 10-2016-0181016. (A machine translation (not reviewed for accuracy) attached.).

* cited by examiner

FIG. 7A

| SAMPLE | FILM FORMING METHOD | FILM FORMING CONDITION |
|---|---|---|
| A | SPUTTERING | SPUTTERING GAS:Ar |
| B | TEOS PE-CDV | CONDITION B |
| C | TEOS PE-CDV | CARRIER GAS:Ar |
| D | TEOS PE-CDV | CARRIER GAS:$N_2$ |
| E | TEOS PE-CDV | FLOW RATE OF TEOS: HALF OF FLOW RATE OF CONDITION B |

FIG. 7B

| SAMPLE | FILM FORMING METHOD | H [atomic%] | C [atomic%] | N [atomic%] | F [atomic%] | Ar [atomic%] | H+C+N+F+Ar [atomic%] |
|---|---|---|---|---|---|---|---|
| A | SPUTTERING | 0.865 | 0.012 | 0.006 | 0.086 | 0.603 | 1.572 |
| B | TEOS PE-CDV | 1.173 | 0.352 | 0.000 | 0.001 | 0.040 | 1.564 |
| C | TEOS PE-CDV | 2.483 | 3.467 | 0.002 | 0.628 | 0.137 | 6.717 |
| D | TEOS PE-CDV | 5.155 | 1.015 | 0.130 | 0.022 | 0.040 | 6.360 |
| E | TEOS PE-CDV | 1.183 | 0.332 | 0.000 | 0.001 | 0.040 | 1.554 |

FIG. 7C

| SAMPLE | Qave | $k^2$ [%] | TCF@fa [ppm/°C] |
|---|---|---|---|
| A | 1115.5 | 8.23 | −21.3 |
| B | 990.3 | 8.49 | −16.3 |
| C | 845.0 | 8.26 | −21.2 |
| D | 890.2 | 8.30 | −19.4 |
| E | 1074.7 | 8.61 | −14.71 |

ACOUSTIC WAVE DEVICE AND METHOD OF FABRICATING THE SAME

CROSS-REFERENCE TO RELATED APPLICATION

This application is based upon and claims the benefit of priority of the prior Japanese Patent Application No. 2016-002013, filed on Jan. 7, 2016, the entire contents of which are incorporated herein by reference.

FIELD

A certain aspect of the present invention relates to an acoustic wave device and a method of fabricating the same.

BACKGROUND

Mobile communication devices typified by smartphones and mobile phones have been sophisticated. To deal with increased volume of data and increased speed in communications, communication standards have been increasingly sophisticated. In frequency bands for wireless communications, a gap between a transmit band and a receive band has narrowed, and the prevention of the interference with the neighboring band has been highly required. Such circumstances require filters and duplexers to have more sophisticated characteristics. For example, to achieve a duplexer having a wide passband and a narrow gap between bands, desired is an acoustic wave device having a low-loss, a large electromechanical coupling coefficient, and excellent temperature characteristics, which means a Temperature Coefficient of Frequency (TCF) close to zero.

Japanese Patent Application Publication No. 2013-055371 (Patent Document 1) discloses a technique that forms a silicon oxide film doped with an element so that the silicon oxide film doped with the element covers a comb-shaped electrode. Japanese Patent Application Publication Nos. 2009-201168 and 2012-149310 (Patent Documents 2 and 3) disclose techniques that form a silicon oxide film by sputtering so that the silicon oxide film covers the comb-shaped electrode.

The silicon oxide film formed so as to cover a comb-shaped electrode can bring the TCF close to zero, and improve the temperature characteristics. However, none of Patent Documents 1 through 3 discloses a technique that allows a resonator to have good temperature characteristics, and improves the characteristics such as a Q-value and an electromechanical coupling coefficient $k^2$ of the resonator.

SUMMARY OF THE INVENTION

According to a first aspect of the present invention, there is provided an acoustic wave device including: a piezoelectric substrate; a comb-shaped electrode that is located on the piezoelectric substrate and excites an acoustic wave; and a silicon oxide film that is located on the piezoelectric substrate so as to cover the comb-shaped electrode, and has a total concentration of carbon (C), hydrogen (H), nitrogen (N), and fluorine (F) equal to or less than 3.5 atomic %.

According to a second aspect of the present invention, there is provided a method of fabricating an acoustic wave device, the method including: forming a comb-shaped electrode, which excites an acoustic wave, on a piezoelectric substrate; and forming a silicon oxide film on the piezoelectric substrate so as to cover the comb-shaped electrode by TEOS-PE-CVD.

BRIEF DESCRIPTION OF THE DRAWINGS

FIG. 7A lists a film forming condition of a silicon oxide film of each of samples A through E, FIG. 7B lists an impurity concentration in the silicon oxide film of each of the samples A through E, and FIG. 7C lists a Q-value, an electromechanical coupling coefficient, and a TCF of each of the samples A through E;

DETAILED DESCRIPTION

Hereinafter, embodiments of the present invention will be described.

First Embodiment

Figure 1A:
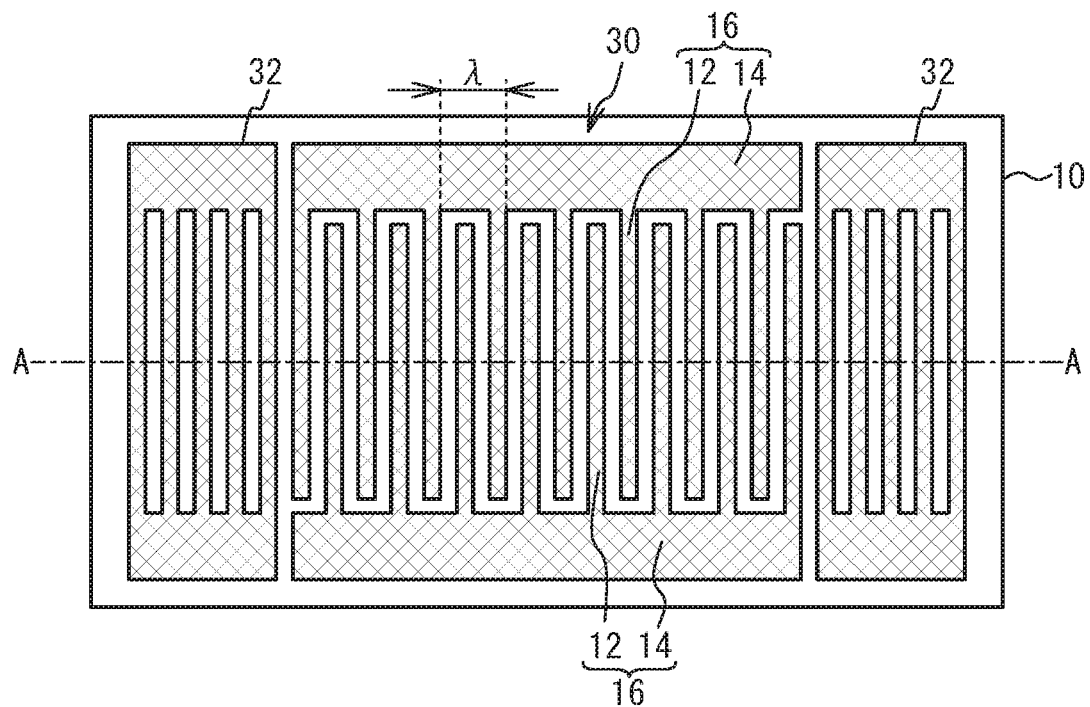
FIG. 1A is a plan view of an acoustic wave resonator in accordance with comparative examples and embodiments.
Figure 1B:
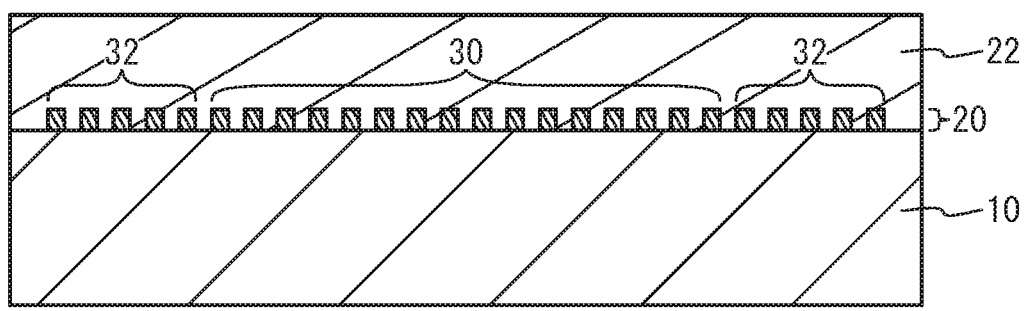
FIG. 1B is a cross-sectional view taken along line A-A in FIG. 1A.

An exemplary structure of an acoustic wave resonator in accordance with comparative examples and embodiments will be described. FIG. 1A is a plan view of an acoustic wave resonator in accordance with the comparative examples and the embodiments, and FIG. 1B is a cross-sectional view taken along line A-A in FIG. 1A. As illustrated in FIG. 1A and FIG. 1B, in a one-port resonator, an Interdigital Transducer (IDT) 30 and reflectors 32 are formed on a piezoelectric substrate 10. The piezoelectric substrate 10 is, for example, a lithium niobate substrate or a lithium tantalate substrate. The IDT 30 and the reflectors 32 are formed of a metal film 20 formed on the piezoelectric substrate 10. The metal film 20 is made of, for example, a copper (Cu) film or an aluminum (Al) film. The IDT 30 includes a pair of comb-shaped electrodes 16 facing each other. The comb-shaped electrode 16 includes a plurality of electrode fingers 12 and a bus bar 14 to which the electrode fingers 12 are connected. The pair of comb-shaped electrodes 16 are arranged so as to face each other so that the electrode fingers 12 of one of the comb-shaped electrodes 16 and the electrode fingers 12 of the other are arranged substantially alternately. A silicon oxide ($SiO_2$) film 22 is formed on the piezoelectric substrate 10 so as to cover the comb-shaped electrodes 16. An acoustic wave excited by the comb-shaped electrode 16 propagates in the array direction of the electrode fingers 12. The acoustic wave is reflected by the reflector 32. The pitch of the electrode fingers 12 in the comb-shaped electrode 16 corresponds approximately to the wavelength λ of the acoustic wave excited by the comb-shaped electrode 16.

The TCF of the silicon oxide film 22 is opposite in sign to the TCF of the piezoelectric substrate 10. Thus, the provision of the silicon oxide film 22 on the piezoelectric substrate 10 decreases the absolute value of the TCF of the acoustic wave resonator. This means that the silicon oxide film 22 functions as a temperature compensation film. The acoustic wave in the silicon oxide film 22 is slower than the surface acoustic wave excited by the piezoelectric substrate 10. Accordingly, the acoustic wave is confined to the silicon oxide film 22 and the piezoelectric substrate 10. The resonant frequency of the acoustic wave resonator can be adjusted by adjusting the film thickness of the silicon oxide film 22. This means that the silicon oxide film 22 can be used as a frequency adjusting film.

Figure 2:
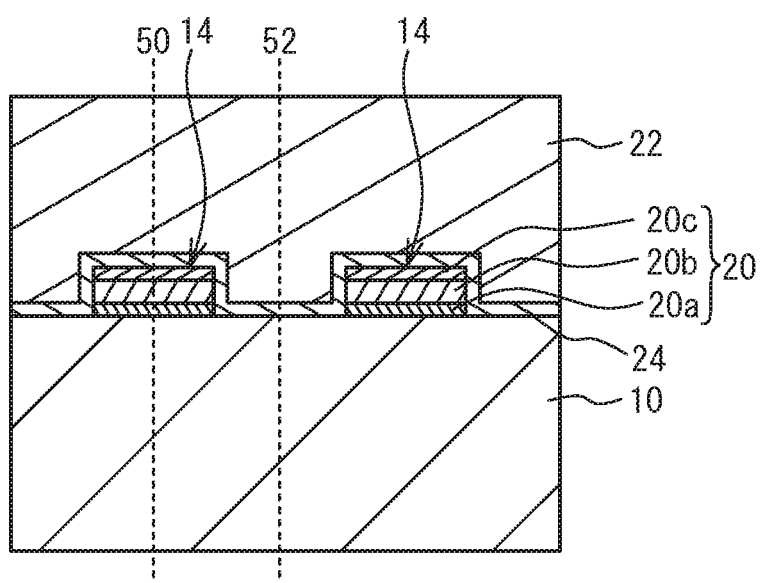
FIG. 2 is a cross-sectional view illustrating a structure used for a simulation.

Simulated were the strain energy of the acoustic wave and the displacement due to the acoustic wave in the piezoelectric substrate 10 and the silicon oxide film 22. FIG. 2 is a cross-sectional view of the structure used for the simulation. As illustrated in FIG. 2, the metal film 20 includes a first film 20a formed on the piezoelectric substrate 10, a second film 20b formed on the first film 20a, and a third film 20c formed on the second film 20b. The first film 20a is a diffusion preventing film that prevents elements of the second film 20b from diffusing into the piezoelectric substrate 10. The third film 20c is an etching stop layer in a step for etching the silicon oxide film 22 to form an aperture to provide an electrical connection. A dielectric film 24 is formed so as to cover the metal film 20. The silicon oxide film 22 is formed on the dielectric film 24.

The conditions used for the simulation are as follows.
Piezoelectric substrate 10: 127.86° rotated Y-cut X-propagation lithium niobate substrate
Pitch λ: 3.84 μm
First film 20a: Titanium (Ti) film with a film thickness of 78 nm
Second film 20b: Cu film with a film thickness of 230 nm
Third film 20c: Chrome (Cr) film with a film thickness of 9 nm
Dielectric film 24: Silicon nitride film with a film thickness of 20 nm
Silicon oxide film 22: Film thickness between the electrode fingers is 1200 nm Simulated were the strain energy and the displacement in the depth direction at the center of the electrode finger 12 indicated by a dashed line 50 in FIG. 2, at the middle between the electrode fingers 12 indicated by a dashed line 52 in FIG. 2, and at the position λ/128 away from the edge of the electrode finger 12 toward the electrode finger 12. The strain energy and the displacement were simulated at a resonant frequency and at an antiresonant frequency.

Figure 3A:
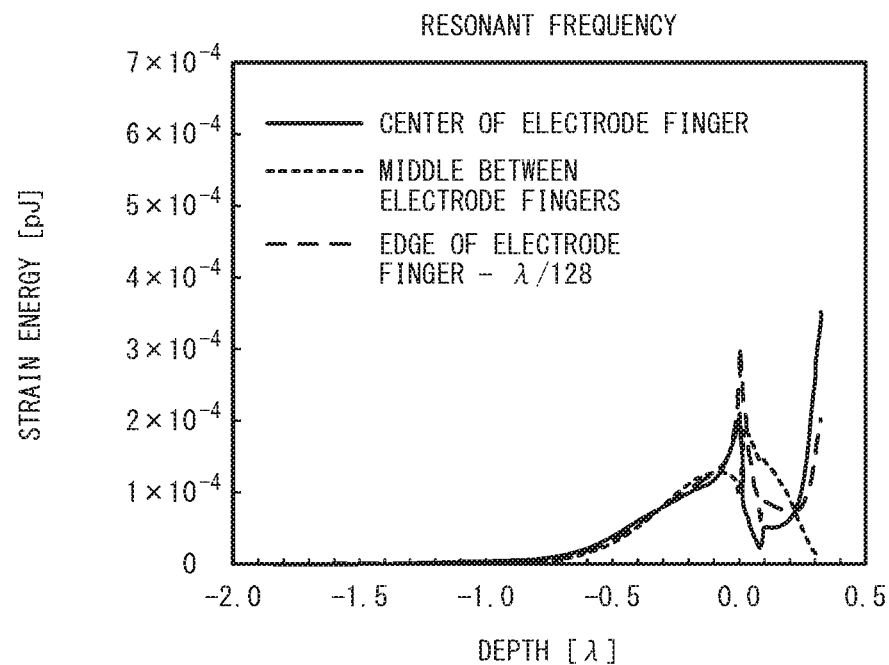
FIG. 3A is a graph of strain energy versus depth at a resonant frequency.
Figure 3B:
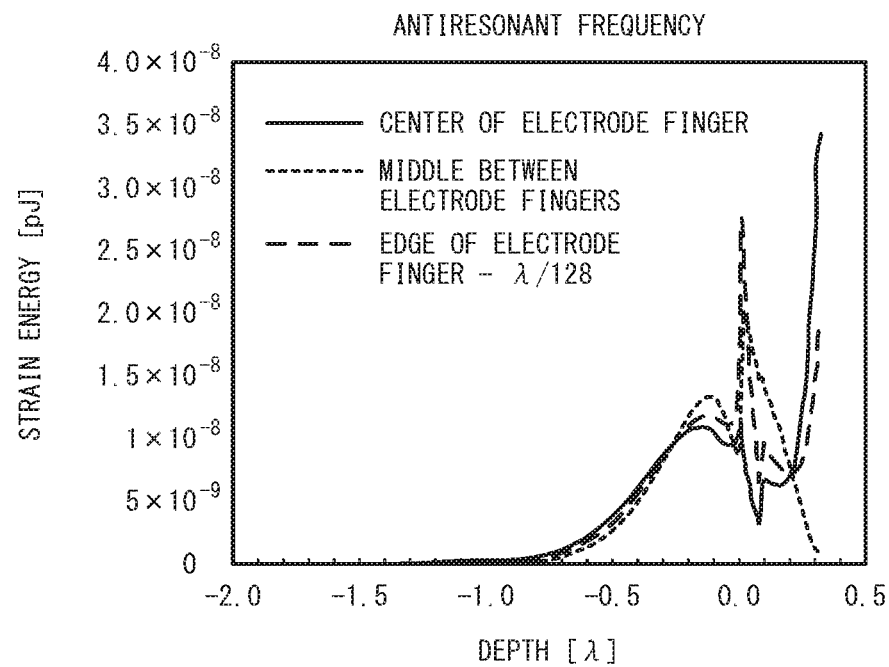
FIG. 3B is a graph of strain energy versus depth at an antiresonant frequency.

FIG. 3A is a graph of strain energy versus depth at the resonant frequency, and FIG. 3B is a graph of strain energy versus depth at the antiresonant frequency. The depth of the surface of the piezoelectric substrate 10 is defined as zero, and the depth in the piezoelectric substrate 10 is represented by a negative value, and the depth in the silicon oxide film 22 is represented by a positive value. In addition, the depth is normalized by dividing a depth by the pitch k. As illustrated in FIG. 3A and FIG. 3B, the strain energy is distributed not only in the piezoelectric substrate 10 but also in the silicon oxide film 22. At the center of the electrode finger and near the edge of the electrode finger, the strain energy is large near the boundary face between the piezoelectric substrate 10 and the silicon oxide film 22 and near the surface of the silicon oxide film. Between the electrode fingers, the strain energy near the surface of the piezoelectric substrate 10 is the largest.

Figure 4A:
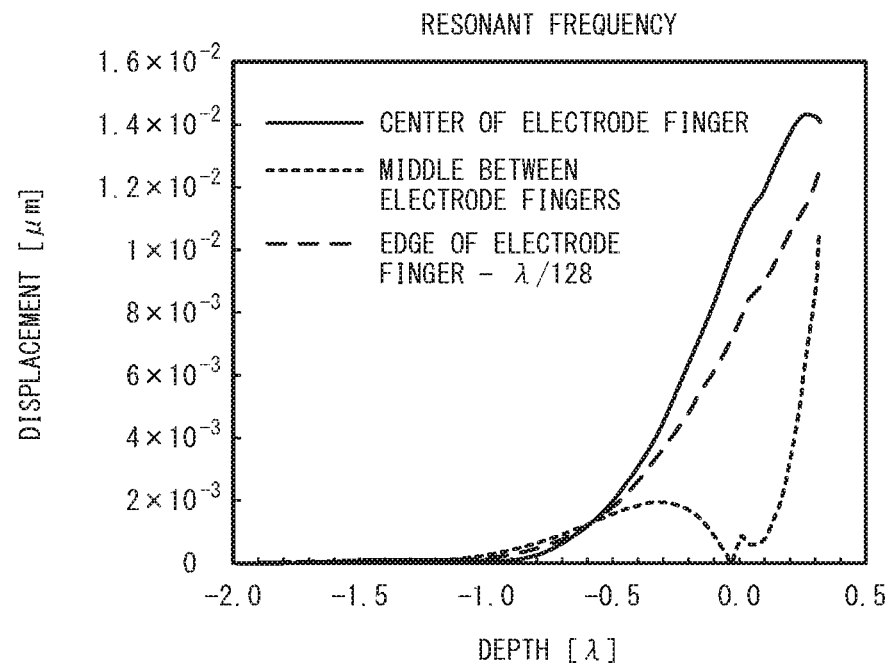
FIG. 4A is a graph of displacement versus depth at the resonant frequency.
Figure 4B:
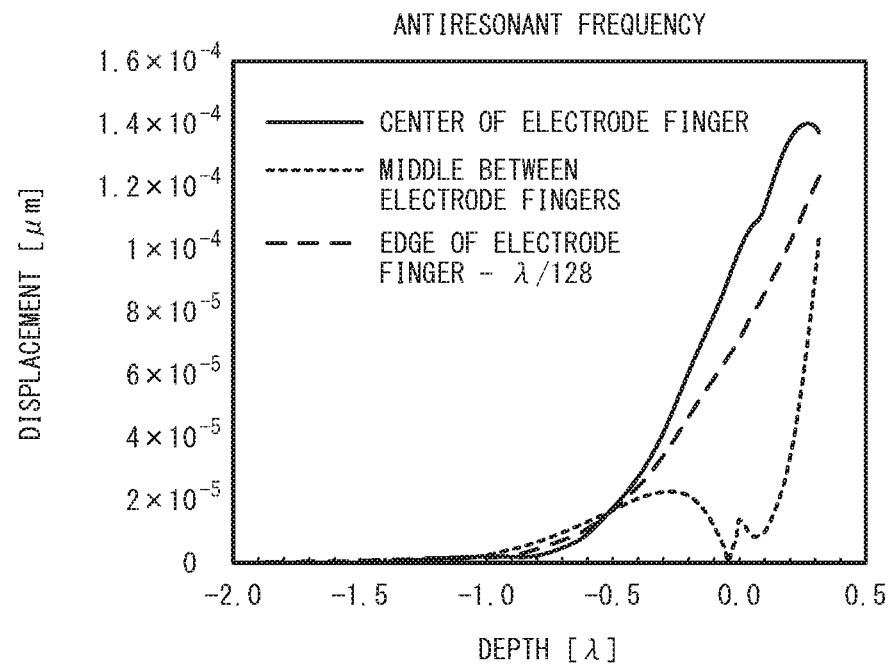
FIG. 4B is a graph of displacement versus depth at the antiresonant frequency.

FIG. 4A is a graph of displacement versus depth at the resonant frequency, and FIG. 4B is a graph of displacement versus depth at the antiresonant frequency. As illustrated in FIG. 4A and FIG. 4B, the displacement in the silicon oxide film 22 is greater than the displacement in the piezoelectric substrate 10. At the center of the electrode finger and near the edge of the electrode finger, the displacement monotonously increases from the inside of the piezoelectric substrate 10 to the surface of the silicon oxide film 22, and the displacement near the surface of the silicon oxide film 22 is the largest. Between the electrode fingers, the displacement near the surface of the piezoelectric substrate 10 is small, and the displacement of the surface of the silicon oxide film 22 is the largest.

First Experiment

As described above, in the acoustic wave device including the silicon oxide film 22 located on the comb-shaped electrode 16, the strain energy in the silicon oxide film 22 is large, and the displacement in the silicon oxide film 22 is greater than the displacement in the piezoelectric substrate 10. Thus, it is considered that the film quality of the silicon oxide film 22 greatly affects the characteristics of the acoustic wave device. Thus, a first experiment changed a method of forming the silicon oxide film 22, and measured the Q-value, the electromechanical coupling coefficient $k^2$, and the TCF of the acoustic wave resonator. As the method of forming the silicon oxide film 22, Tetraethyl orthosilicate (TEOS)-Plasma Enhanced (PE)-Chemical Vapor Deposition (CVD) was mainly used. The use of TEOS-PE-CVD allows the silicon oxide film 22 to be embedded between the electrode fingers 12 even in a fine structure in which the width of the electrode finger 12 and the width between the electrode fingers 12 are equal to or less than 2 μm. Thus, the flatness of the upper surface of the silicon oxide film 22 can be increased.

Figure 5:
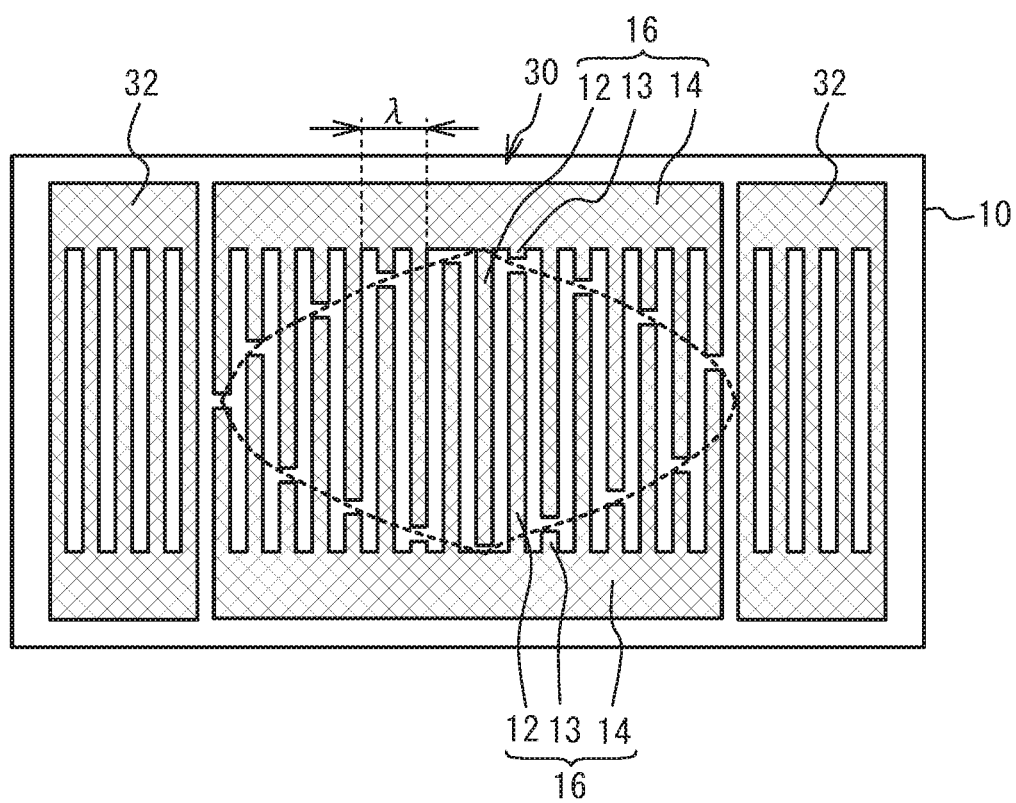
FIG. 5 is a plan view of a sample fabricated in an experiment.

FIG. 5 is a plan view of a sample fabricated in the experiment. As illustrated in FIG. 5, the fabricated one-port resonator is an apodized resonator. The comb-shaped electrode 16 includes the electrode fingers 12, dummy electrode fingers 13, and the bus bar 14. The electrode fingers 12 of one of the comb-shaped electrodes 16 face the dummy electrode fingers 13 of the other of the comb-shaped electrodes 16 in a direction perpendicular to the propagation direction of the acoustic wave. The length along which the electrode fingers 12 overlap (aperture length) is modulated in accordance with ArcCos in the propagation direction of the acoustic wave. Other configurations are the same as those illustrated in the plan view of FIG. 1A and the cross-sectional view of FIG. 1B, and the description is omitted.

Figure 6A:
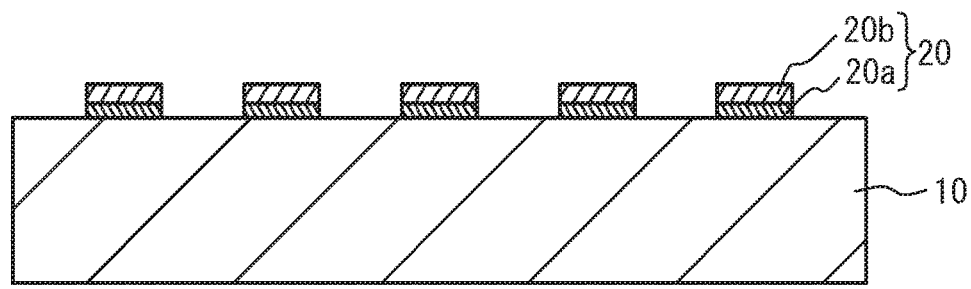
FIG. 6A through FIG. 6C are cross-sectional views illustrating a method of fabricating the sample used for the experiment.
Figure 6B:
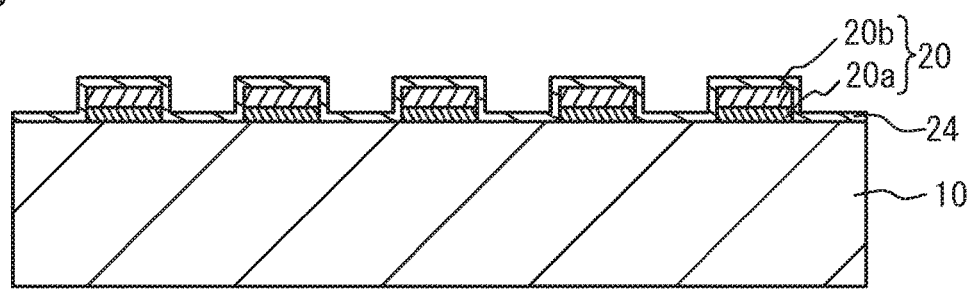
Figure 6C:
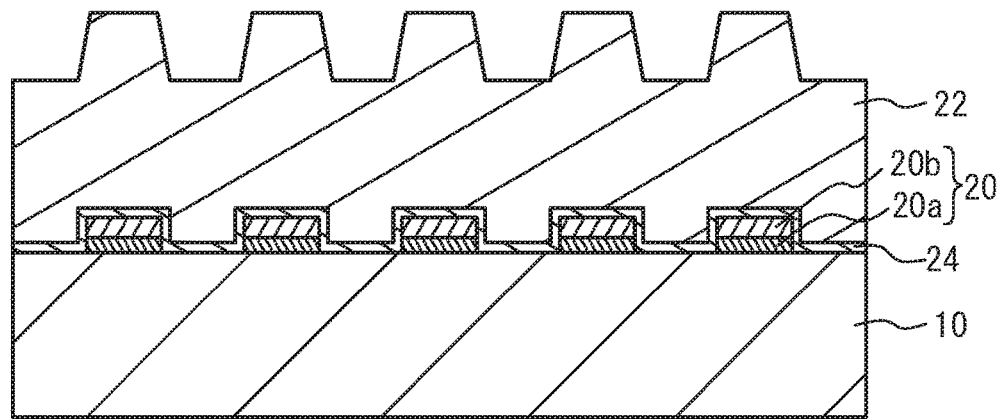

The fabricating conditions of the sample are as follows.
Piezoelectric substrate 10: 127.86° rotated Y-cut X-propagation lithium niobate substrate
Number of pairs: 55 pairs
Pitch λ: 3.84 μm
Maximum aperture length: 35λ
First film 20a: Ti film with a film thickness of 25 nm
Second film 20b: Cu film with a film thickness of 238 nm
Third film 20c: Cr film with a film thickness of 10 nm
Dielectric film 24: Silicon nitride film with a film thickness of 20 nm
Silicon oxide film 22: Film thickness between the electrode fingers is 1060 nm FIG. 6A through FIG. 6C are cross-sectional views illustrating a method of fabricating the sample used for the experiment. As illustrated in FIG. 6A, the first film 20a, the second film 20b, and the third film (not illustrated) are formed on the piezoelectric substrate 10. As illustrated in FIG. 6B, the dielectric film 24 is formed on the piezoelectric substrate 10 so as to cover the metal film 20 by sputtering. The dielectric film 24 may be formed by evaporation or Atomic Layer Deposition (ALD). In addition, as illustrated in FIG. 6C, the silicon oxide film 22 is formed on the dielectric film 24.

FIG. 7A lists a film forming condition of the silicon oxide film in each of samples A through E, FIG. 7B lists an impurity concentration in the silicon oxide film in each of the samples A through E, and FIG. 7C lists the Q-value, the electromechanical coupling coefficient, and the TCF of each of the samples A through E. As illustrated in FIG. 7A, the silicon oxide film 22 of the sample A was formed by bias sputtering of which the target was silicon (Si) and the sputtering gas was a mixture of oxygen ($O_2$) gas and argon (Ar) gas. To increase the flatness of the upper surface of the silicon oxide film 22, sputtering of the silicon oxide film and etch back of the silicon oxide film are alternately repeated. The target may be silicon oxide, and the sputtering gas may be argon (Ar).

In the samples B through E, the silicon oxide film 22 was formed by TEOS. The film formation temperature is approximately 300° C. to obtain good film quality. Even when the film formation temperature is a high temperature of 300° C., since the metal film 20 is covered with the dielectric film 24, the diffusion of atoms contained in the metal film 20 into the silicon oxide film 22 and/or the chemical reaction between the film formation atmosphere of the silicon oxide film and the metal film 20 can be inhibited.

The film forming condition of the sample B was a condition B. Under the condition B, the silicon oxide film 22 was formed with use of a TEOS gas and an oxygen ($O_2$) gas, the TEOS gas being vaporized by a method without using a carrier gas. The silicon oxide film 22 of the sample C was formed by using an argon (Ar) gas as a carrier gas. The silicon oxide film 22 of the sample D was formed by using a nitrogen ($N_2$) gas as a carrier gas. The flow rate of the TEOS gas in the samples C and D is 1 to 1.5 times greater than the flow rate of the TEOS gas of the condition B. The film forming condition of the sample E is the same as the condition B except that the flow rate of the TEOS gas is a half of the flow rate of the TEOS gas of the condition B. The carrier gas also has a function of vaporizing TEOS. The samples B and E were fabricated by the method without using a carrier gas. The samples A, C, and D correspond to the comparative example, and the samples B and E correspond to the first embodiment.

The concentration of each element in FIG. 7B was measured by Secondary Ion Mass Spectrometry (SIMS). The analyzed elements are silicon (Si), oxygen (O), carbon (C), hydrogen (H), nitrogen (N), fluorine (F), and Ar. The measurement device is PHI ADEPT1010 (registered trademark), the primary ion species is $Cs^+$, the primary acceleration voltage is 5.0 kV, and the detection region is 60 μm×60 μm. Elements other than Si and O are impurities of the silicon oxide film 22. Values stored in columns of H, C, N, F, and Ar in FIG. 7B respectively represent atomic concentrations of H, C, N, F, and Ar. The value stored in the column of H+C+N+F+Ar represents the total atomic concentration of above impurities. In the column of Ar, 0.04 atomic % represents a value equal to or less than the detection limit of Ar. Although the detection limit differs depending on elements, the elements other than Ar were analyzed in a region greater than the detection limit.

As illustrated in FIG. 7B, in the sample A, the total concentration of impurities is low but the Ar concentration is high. In the sample B, the total concentration of impurities is low, and the Ar concentration is equal to or less than the detection limit. In the sample C, the H concentration, the C concentration, the F concentration, and the Ar concentration are high, and the total concentration of impurities is also high. In the sample D, the H concentration, the C concentration, and the N concentration are high, and the total concentration of impurities is also high, but the Ar concentration is equal to or less than the detection limit. In the sample E, the total concentration of impurities is low, and the Ar concentration is equal to or less than the detection limit. As described above, when the silicon oxide film 22 is formed by sputtering, the Ar concentration is high. When TEOS-PE-CVD using a carrier gas is used, the concentrations of impurities are high. The concentrations of impurities resulting from the carrier gas are high. When TEOS-PE-CVD without using a carrier gas is used, the concentrations of impurities are low.

Figure 8A:
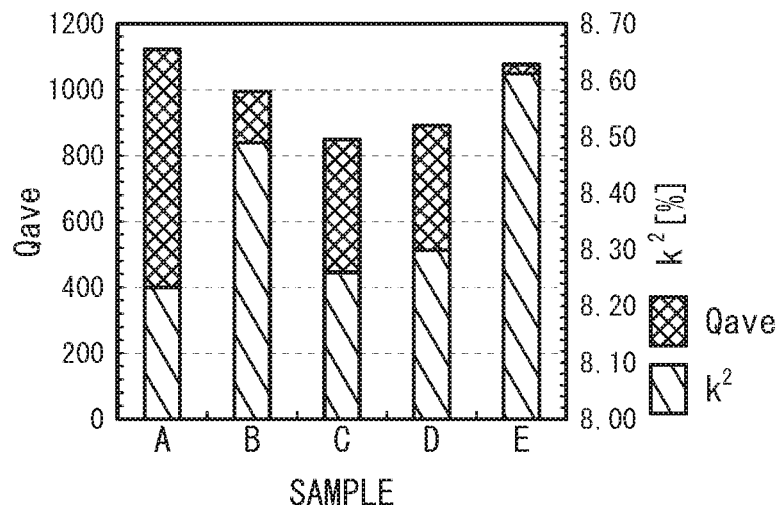
FIG. 8A illustrates Qave and $k^2$ with respect to each sample.
Figure 8B:
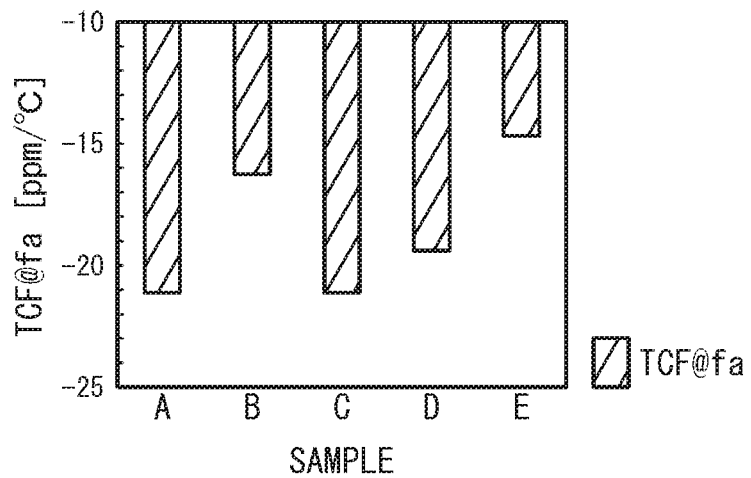
FIG. 8B illustrates a TCF at the antiresonant frequency with respect to each sample.
Figure 8C:
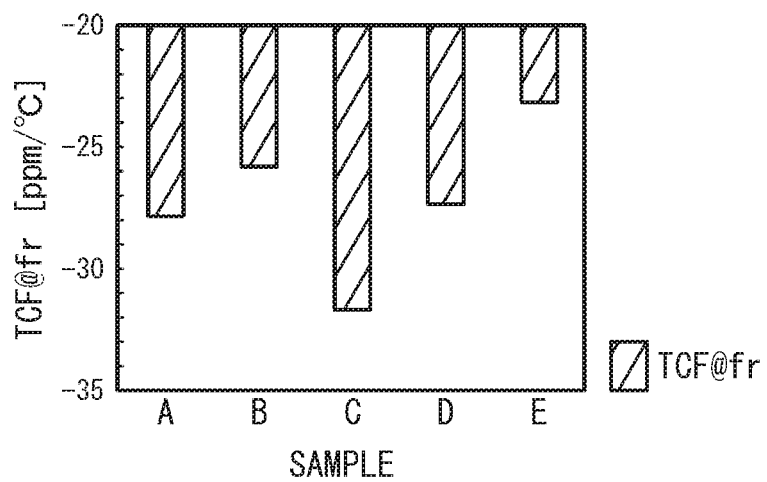
FIG. 8C illustrates a TCF at the resonant frequency with respect to each sample.

FIG. 8A illustrates Qave and $k^2$ with respect to each sample, FIG. 8B illustrates TCF at the antiresonant frequency with respect to each sample, and FIG. 8C illustrates TCF at the resonant frequency with respect to each sample. The Qave is an average of Q values between the resonant frequency and the antiresonant frequency. The TCF differs by 6 to 10 ppm/° C. in terms of absolute value between the resonant frequency and the antiresonant frequency. However, the relative tendency among samples hardly changes. Thus, hereinafter, the TCF at the antiresonant frequency fa will be presented as a representative. As illustrated in FIG. 7C, FIG. 8A, and FIG. 8B, in the sample A, although the Q-value is large, the $k^2$ is small, and the TCF is negatively large. In the samples C and D, the $k^2$ and the TCF are approximately equal to the $k^2$ and the TCF of the sample A, respectively, and the Q-value is less than the Q-value of the sample A. In the sample B, the $k^2$ is greater than the $k^2$ of the sample A, the TCF is closer to zero than the TCF of the sample A (i.e., the absolute value is less than that of the sample A), and the Q-value is less than the Q-value of the sample A. In the sample E, the Q-value is approximately equal to the Q-value of the sample A, the $k^2$ is greater than the $k^2$ of the sample A, and the TCF is closer to zero than the TCF of the sample A.

As described above, the samples B and E of which the total concentration of impurities and the Ar concentration are low have a good Q-value, a good $k^2$, and a good TCF. In contrast, the sample A has low concentrations of impurities, but has a high Ar concentration. At this time, the Q-value is high, but the $k^2$ and the TCF are bad.

Figure 9A:
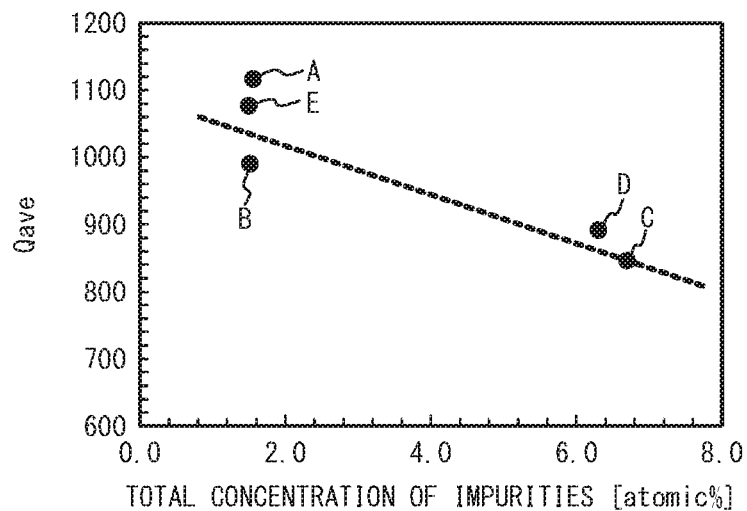
FIG. 9A is a graph of Qave versus total concentration of impurities.
Figure 9B:
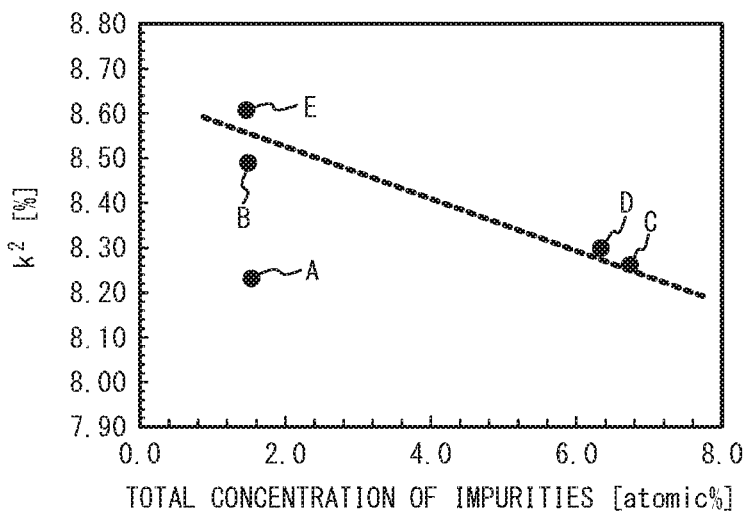
FIG. 9B is a graph of $k^2$ versus total concentration of impurities.
Figure 9C:
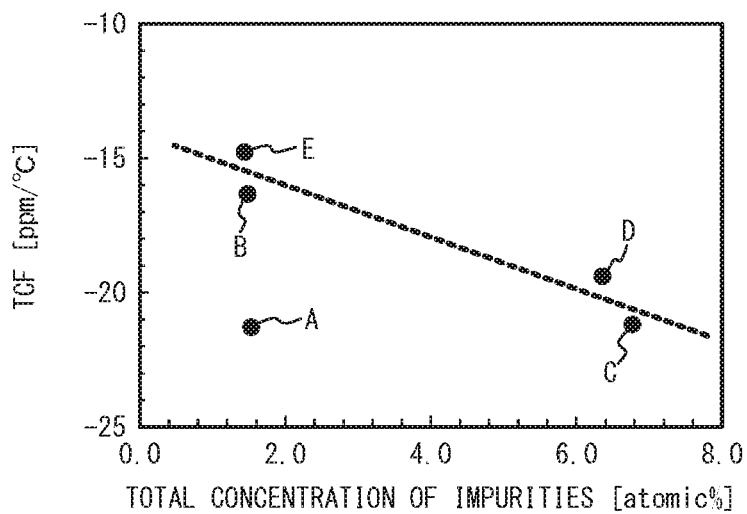
FIG. 9C is a graph of TCF versus total concentration of impurities.

FIG. 9A is a graph of Qave versus total concentration of impurities, FIG. 9B is a graph of $k^2$ versus total concentration of impurities, and FIG. 9C is a graph of TCF versus total concentration of impurities. The dashed line in each figure indicates the tendency of the samples excluding the sample A. As illustrated in FIG. 9A, as the total concentration of impurities decreases, the Qave increases. The sample A has the same tendency. As illustrated in FIG. 9B, as the total concentration of impurities decreases, the $k^2$ increases. The sample A is free from this tendency. That is, the sample A has a low total concentration of impurities, but has a small $k^2$. As illustrated in FIG. 9C, as the total concentration of impurities decreases, the TCF becomes closer to zero. The sample A is free from this tendency. That is, the TCF is negatively large even at a low total concentration of impurities.

As described above, the samples A through E reveal that the impurity concentration correlates with the Q-value, the $k^2$, and the TCF. It is revealed that when the Ar concentration is high, the $k^2$ and the TCF are bad even when the impurity concentration is low. The Ar concentration affects the $k^2$ and the TCF at a lower concentration than concentrations at which other impurities C, H, and N affect the $k^2$ and the TCF. Ar is used as a sputtering gas in sputtering. Therefore, it is difficult to inhibit Ar being absorbed into the silicon oxide film. Especially when bias sputtering is used to increase the flatness of the upper surface of the silicon oxide film 22, the Ar concentration in the silicon oxide film increases.

In TEOS-PE-CVD, tetraethyl orthosilicate is decomposed in plasma, and oxidized to form a $SiO_2$ thin film. The reaction formula is as follows.

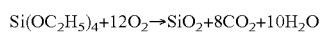

$$Si(OC_2H_5)_4 + 12O_2 \rightarrow SiO_2 + 8CO_2 + 10H_2O$$

As described above, many C and H are produced during the reaction process. Therefore, depending on the film forming condition, impurities such as C and H are introduced into the silicon oxide film. The silicon oxide film formed by TEOS-PE-CVD is used for a passivation film. When the silicon oxide film is used for a passivation film, the film quality (the function of the film) other than the film quality for securing the insulation property and the resistance to the water absorption are never considered.

When the film formation rate is increased to increase the productivity, desorption of impurities (decomposition of TEOS), and the combustion and exhaust of desorbed impurities are not sufficiently performed. Accordingly, the impurities are absorbed into the silicon oxide film. This increases the impurity concentration in the silicon oxide film. In the samples B through D, it is considered that impurities such as C and H were introduced because the TEOS was insufficiently decomposed, and produced impurities were insufficiently combusted and exhausted. This is considered the reason why the Q-value deteriorates.

To decrease the impurity concentration in the silicon oxide film, it is considered to use a condition that promotes the decomposing and the combustion of TEOS. For example, when a TEOS flow rate is decreased, the supply of TEOS can be decreased. Increase in flow rate of the oxygen gas can promote the combustion of TEOS. Increase in plasma power can promote the combustion of TEOS. Increase in film formation temperature can promote the combustion of TEOS. The use of at least one of the above techniques can promote the decomposition and the combustion of TEOS, and decrease the impurity concentration in the silicon oxide film.

Second Experiment

The silicon oxide film 22 was formed by TEOS-PE-CVD under various conditions. Various samples were fabricated by changing the flow rate of TEOS, the flow rate of an oxygen gas, the film formation temperature, and a power of a high-frequency signal for producing plasma. The Ar concentration in each of the samples is equal to or less than the detection limit. Other configurations of the samples are the same as those of the first experiment, and thus the description is omitted.

Figure 10A:
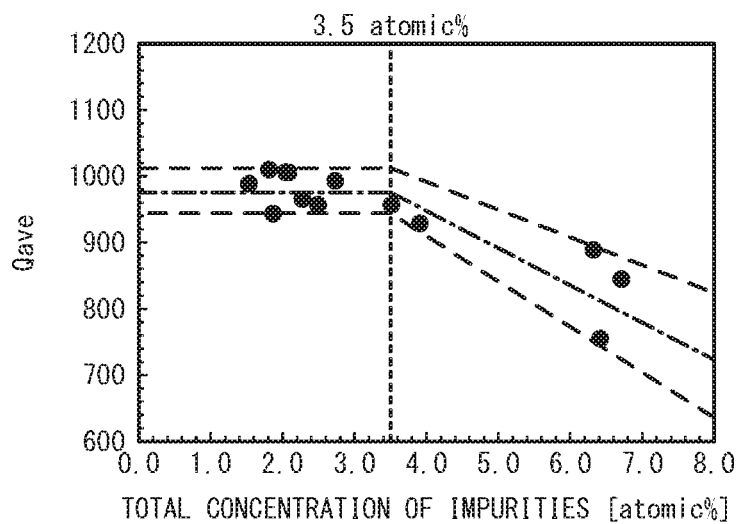
FIG. 10A is a graph of Qave versus total concentration of impurities in the fabricated sample.
Figure 10B:
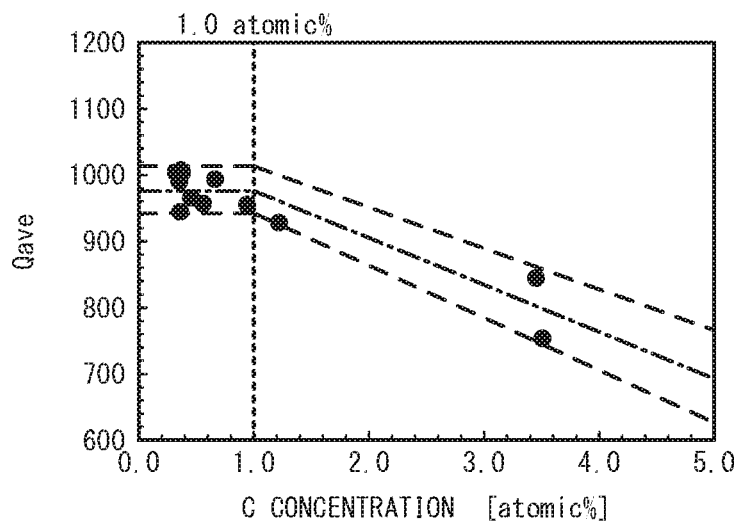
FIG. 10B is a graph of Qave versus C concentration in the fabricated sample.
Figure 10C:
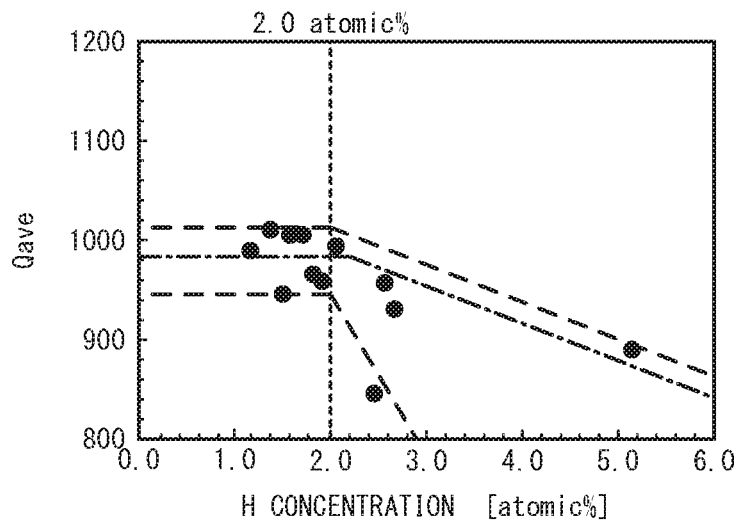
FIG. 10C is a graph of Qave versus H concentration in the fabricated sample.

Under the condition same as that of the first experiment, the impurity concentration in the silicon oxide film was measured by SIMS. FIG. 10A is a graph of Qave versus total concentration of impurities in the fabricated samples, FIG. 10B is a graph of Qave versus C concentration in the fabricated samples, and FIG. 10C is a graph of Qave versus H concentration in the fabricated samples. In FIG. 10A through FIG. 10C, the chain line is an auxiliary line indicating the tendency of the Q-value, and the dashed lines are auxiliary lines indicating the variation in the Q-value. The Q-value and the variation in the Q-value were assumed to be constant at concentrations equal to or less than a threshold value, and the auxiliary lines of the Q-value and the variation in the Q-value were assumed to be linear functions of the concentration at concentrations equal to or greater than the threshold value.

As illustrated in FIG. 10A, when the total concentration of impurities (H, C, N, F, and Ar) is equal to or less than 3.5 atomic %, the minimum value of the Qave is approximately 970, the maximum value is approximately 1020, and the width between the minimum value and the maximum value is approximately 70. As presented, the Q-value is stable. In contrast, at total concentrations of impurities greater than 3.5 atomic %, the Qave decreases. Furthermore, the variation in Qave increases. For example, when the total concentration of impurities is near 6.5 atomic %, the minimum value of the Qave is approximately 755, the maximum value is approximately 895, and the width between the minimum value and the maximum value is approximately 140. As described above, the width between the minimum value and the maximum value is two times greater than the width between the minimum value and the maximum value when the total concentration of impurities is equal to or less than 3.5 atomic %.

As illustrated in FIG. 10B, when the C concentration is 1.0 atomic % or less, the Qave has a small dependence on the C concentration and a small variation. At C concentrations greater than 1.0 atomic %, the Qave decreases. Furthermore, the variation in Qave increases. As illustrated in FIG. 10C, when the H concentration is 2.0 atomic % or less, the Qave has a small dependence on the H concentration and a small variation. At H concentrations greater than 2.0 atomic %, the Qave decreases. Furthermore, the variation in Qave increases. There is a data point at which the Qave is small when the H concentration is near 2.4 atomic %. This is because the C concentration is high. When the C concentration and the H concentration are the same, C affects the Qave more than H does. The auxiliary line indicating the tendency of the Qave is illustrated by excluding this data point.

As described above, when the impurity concentrations of C and H are equal to or less than the threshold concentrations, the Q-value has a small dependence on the impurity concentration and a small variation. When the impurity concentration becomes greater than the threshold concentration, the Q-value decreases as the concentration increases.

Moreover, as the impurity concentration increases, the variation in the Q-value increases.

The reason is considered as follows. The Q-value is affected by, in addition to the impurity concentration, film qualities including the composition ratio of Si and O in $SiO_2$, an oxygen deficiency amount, a vacancy concentration, an amount of multi-membered ring structure, a Young's modulus, a density, and a hardness. In a silicon oxide film with a low impurity concentration, dense, highly elastic, and uniform Si—O molecular vibration is achieved. Thus, the effect of factors other than the impurity concentration on the Q-value becomes relatively small. Accordingly, when the impurity concentration is equal to or less than the threshold concentration, the Q-value becomes flat, and the variation becomes small. On the other hand, when the impurity concentration is equal to or greater than the threshold concentration, impurity atoms replace Si and/or O in the Si—O network, impurity atoms cause the defect of Si and/or O, and/or impurity atoms exist near Si—O. These phenomena disturb the molecular vibration of Si—O. Accordingly, the Q-value decreases. Furthermore, the effect of the film quality other than the impurity concentration on the Q-value increases, and the variation in the Q-value increases.

Figure 11:
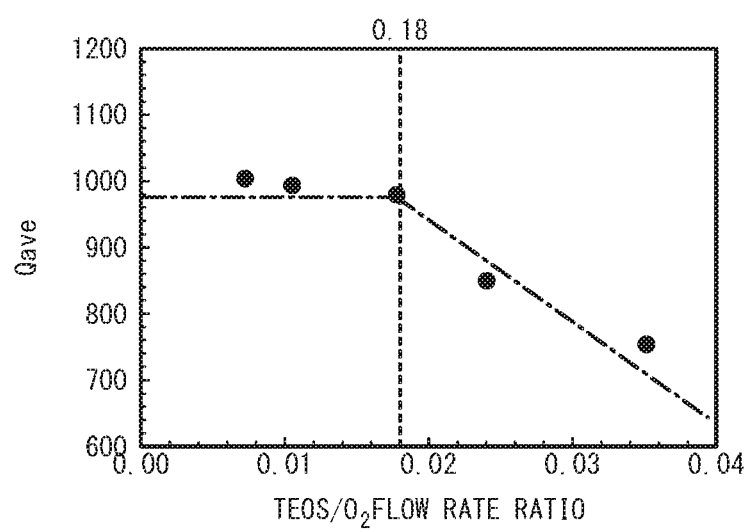
FIG. 11 is a graph of Qave versus flow rate ratio of TEOS and oxygen gas.

It is considered that the impurity concentration in the silicon oxide film relates to the decomposition and the combustion of TEOS. Thus, measured was the Qave with respect to a flow rate ratio of TEOS and oxygen gas ($TEOS/O_2$ flow rate ratio). FIG. 11 is a graph of Qave versus flow rate ratio of TEOS and oxygen gas. Samples of which the $TEOS/O_2$ flow rate ratio is 0.35, 0.24, 0.18, 0.10, and 0.07 were used. As illustrated in FIG. 11, when the $TEOS/O_2$ flow rate ratio is 0.18 or greater, the Qave is constant. When the $TEOS/O_2$ flow rate ratio is greater than 0.18, as the $TEOS/O_2$ flow rate ratio increases, the Qave decreases. For example, when the $TEOS/O_2$ flow rate ratio is 0.14, the variation in the Q-value is reduced even when the flow rate ratio varies within a range of ±0.04. Accordingly, the characteristics of the acoustic wave device are stabilized.

Within a range in which the $TEOS/O_2$ flow rate ratio is small (for example, a range in which the $TEOS/O_2$ flow rate ratio is 0.18 or less), the amount of $O_2$ with respect to the amount of TEOS is large. Thus, when the silicon oxide film is formed, the combustion, the decomposition, and desorption of TEOS are promoted. Accordingly, the concentration of impurities such as C or H in the silicon oxide film decreases. This is considered the reason why the Q-value is improved and stabilized.

The reason why the $k^2$ and the TCF are bad regardless of the impurity concentration when the Ar concentration is high is considered as follows. For example, the peak wavenumber of Fourier Transform Infrared Spectroscopy (FTIR) in Patent Document 1 is used as an index of the bond angle of a Si—O bond, and the half width is used as an index of uniformity. As disclosed in Patent Document 1, the bond angle of a Si—O bond and the uniformity in the silicon oxide film affect the TCF. The bond angle and the uniformity also affect the $k^2$. As illustrated in FIG. 8A, FIG. 8B, FIG. 9B, and FIG. 9C, the effect of Ar on the TCF and the $k^2$ differs from those of impurities such as C, H, N, and F. Accordingly, the way how Ar atoms are introduced into a Si—O network is considered different from that of other impurities.

An amorphous structure in which $SiO_2$ containing Ar atoms is melted and solidified was simulated by first principles. The result of the simulation reveals that Ar atoms are not introduced into a Si—O network, and are accommodated interstitially between Si and O. It is considered that interstitial Ar disturbs Si—O vibration. Thus, it is considered that when Ar is introduced into the silicon oxide film 22, the TCF and the $k^2$ deteriorate. On the other hand, C atoms and H atoms replace O in the Si—O bond.

The first embodiment configures the total concentration of C, H, N, and F in the silicon oxide film 22 to be 3.5 atomic % or less. This configuration can improve the Q-value as illustrated in FIG. 10A. In addition, the variation in the Q-value can be reduced. Therefore, the characteristics including the loss of the acoustic wave device are improved, and the variation in characteristics can be reduced. The total concentration of C, H, N, and F in the silicon oxide film 22 is preferably 3.0 atomic % or less, more preferably 2.5 atomic % or less. The use of TEOS-PE-CVD makes the total concentration of C, H, N, and F, for example, equal to or greater than 1.5 atomic %.

In addition, the Ar concentration in the silicon oxide film 22 is 0.1 atomic % or less. This configuration improves the electromechanical coupling coefficient $k^2$ as illustrated in FIG. 8A, FIG. 8B, FIG. 9B, and FIG. 9C. In addition, the TCF improves. The Ar concentration in the silicon oxide film 22 is preferably 0.06% or less. In addition, the Ar concentration is more preferably equal to or less than 0.04% that is equal to or less than the detection limit in FIG. 7B.

Furthermore, the C concentration in the silicon oxide film 22 is 1 atomic % or less. This configuration can improve the Q-value as illustrated in FIG. 10B. In addition the variation in the Q-value can be reduced. The C concentration in the silicon oxide film 22 is preferably 0.8 atomic % or less, more preferably 0.6 atomic % or less. The use of TEOS-PE-CVD makes the C concentration, for example, equal to or greater than 0.3 atomic %.

Furthermore, the H concentration in the silicon oxide film 22 is 2 atomic % or less. This configuration can improve the Q-value as illustrated in FIG. 10C. In addition, the variation in the Q-value can be reduced. The H concentration in the silicon oxide film 22 is preferably 1.8 atomic % or less, more preferably 1.6 atomic % or less. The use of TEOS-PE-CVD makes the C concentration, for example, equal to or greater than 1 atomic %.

The first embodiment has described an exemplary case where the silicon oxide film 22 is formed by TEOS-PE-CVD. As already described above, the method of forming the silicon oxide film 22 may be other than TEOS-PE-CVD because the impurity concentration in the silicon oxide film 22 affects the Q-value and the variation in the Q-value.

When the silicon oxide film 22 is formed by, for example, sputtering, the Ar concentration becomes high. Thus, the silicon oxide film is preferably formed by TEOS-PE-CVD. As illustrated in FIG. 7A through FIG. 7C, to reduce the impurity concentration, a carrier gas is preferably not used.

According to the above discussion, the film quality in the silicon oxide film 22 greatly affects the Q-value, the $k^2$, and the TCF. Therefore, the material of the piezoelectric substrate 10, the film thickness and the material of the metal film 20 do not have a big impact on the above experiment results. The piezoelectric substrate 10 may be, for example, a lithium tantalate instead of a lithium niobate substrate.

When the piezoelectric substrate 10 is a rotated Y-cut X-propagation lithium niobate substrate, the electromechanical coupling coefficient of a Rayleigh wave is the largest at a rotated Y-cut angle of 127.86°. Simulated by the Cambell & Jones method, the electromechanical coupling coefficient of the Rayleigh wave is greater than those of other modes at a rotated Y-cut angle from 120° to 140°, and the Rayleigh wave becomes a primary mode. In this range, the leaky wave has an electromechanical coupling coefficient less than that of the Rayleigh wave, and becomes an unnecessary wave. Therefore, the rotated Y-cut angle is preferably 120° or greater and 140° or less. In addition, considering production tolerance with respect to 127.86°, the rotated Y-cut angle is more preferably 126° or greater and 130° or less.

The metal film 20 may be made of, for example, an Al film instead of a Cu film. When a film mainly composed of Cu is used as the second film 20b of the metal film 20, to reduce the diffusion of Cu into the piezoelectric substrate 10, or to secure the adhesiveness with the piezoelectric substrate 10, a film mainly composed of Ti or the like is preferably used as the first film 20a. To reduce the diffusion of Cu into the silicon oxide film 22, the dielectric film 24 is preferably located.

The dielectric film 24 may be made of, for example, a silicon oxide film or a silicon nitride film. To reduce the change of properties of the metal film 20 during the film formation, the dielectric film 24 is formed at a temperature lower than the temperature at which the silicon oxide film 22 is formed. The film formation temperature at which the silicon oxide film is formed by TEOS-PE-CVD is, for example, approximately 300° C. to obtain good film quality. Thus, the film formation temperature of the dielectric film 24 is preferably, for example, 200° C. or less. Accordingly, the dielectric film 24 is preferably formed by sputtering or evaporation. When the silicon oxide film is formed, to reduce the film formation temperature, the use of sputtering is preferable. The film thickness of the dielectric film 24 is preferably 3% or greater of the film thickness of the metal film 20 so as not to expose the metal film 20. As the film thickness of the dielectric film 24 increases, the dielectric film 24 disturbs the function of the silicon oxide film 22 as a temperature adjusting film. In addition, the resonance characteristics including the Q-value and the $k^2$ deteriorate. Therefore, the film thickness of the dielectric film 24 is preferably 20% or less of the film thickness of the metal film 20.

When the metal film 20 is made of an Al film, Al hardly diffuses into the piezoelectric substrate 10 and the silicon oxide film 22. Thus, the first film 20a and/or the dielectric film 24 that is a diffusion preventing film may not be necessarily located.

To make the silicon oxide film 22 function as a temperature compensation film or a frequency adjusting film, the film thickness of the silicon oxide film 22 is preferably equal to or greater than the film thickness of the electrode finger 12, more preferably two times greater than the film thickness of the electrode finger 12, further preferably four times greater than the film thickness of the electrode finger 12.

Figure 12:
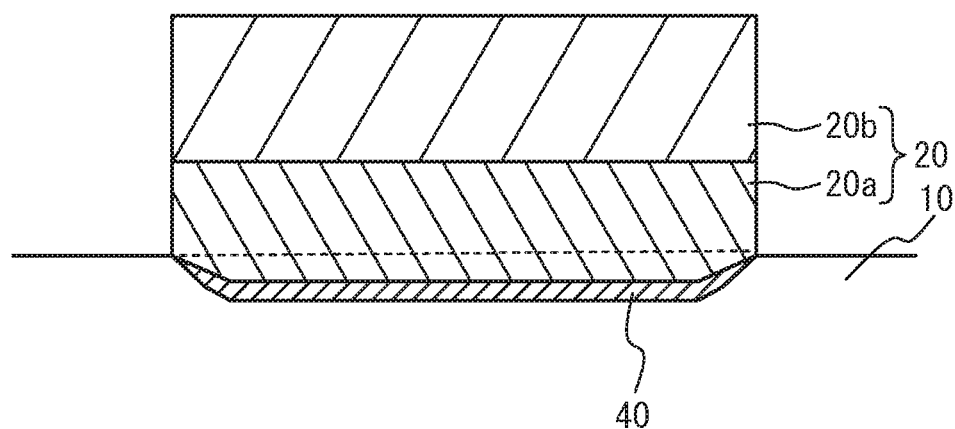
FIG. 12 is a cross-sectional view near a metal film of the fabricated sample.

FIG. 12 is a cross-sectional view near the metal film of the fabricated sample. As illustrated in FIG. 12, a diffusion region 40 with a depth of approximately 3 nm is formed in the surface of the piezoelectric substrate 10. The diffusion region 40 is a region where Ti atoms in the first film 20a diffused into the piezoelectric substrate 10 when the dielectric film 24 and the silicon oxide film 22 were formed. In the diffusion region 40, the composition ratio of Nb is greater than the stoichiometric composition ratio of lithium niobate (i.e., niobium rich). For example, Transmission Electron Microscope (TEM) images allow the boundary face between the piezoelectric substrate 10 and the diffusion region 40 to be clearly observed. The thickness of the diffusion region 40 is approximately one tenth of the pitch λ. Therefore, the diffusion region 40 hardly affects the characteristics of the acoustic wave device. When the diffusion region 40 is formed, the lower part of the comb-shaped electrode 16 is practically embedded in the piezoelectric substrate 10. Therefore, the comb-shaped electrode 16 and the piezoelectric substrate 10 are bonded to each other more firmly, and the adhesiveness between the comb-shaped electrode 16 and the piezoelectric substrate 10 improves. Such a structure causes the energy excited by the comb-shaped electrode 16 to directly act on the piezoelectric substrate 10. This means that the acoustic wave can be efficiently excited and the electromechanical coupling coefficient $k^2$ thus improves.

As described above, the piezoelectric substrate 10 includes, under the comb-shaped electrode 16, the diffusion region 40 in which at least one or some of atoms in the comb-shaped electrode 16 are diffused. This configuration improves the electromechanical coupling coefficient.

In addition, the comb-shaped electrode 16 includes a Ti film located on the piezoelectric substrate 10, and a Cu film located on the Ti film. Ti diffuses into the diffusion region 40. Thus, the deep diffusion region 40 is not formed, and the resonance characteristics of the acoustic wave device never deteriorate. Since the comb-shaped electrode 16 and the piezoelectric substrate 10 firmly bond to each other, the electromechanical coupling coefficient improves.

Second Embodiment

Figures 13A, 13B:
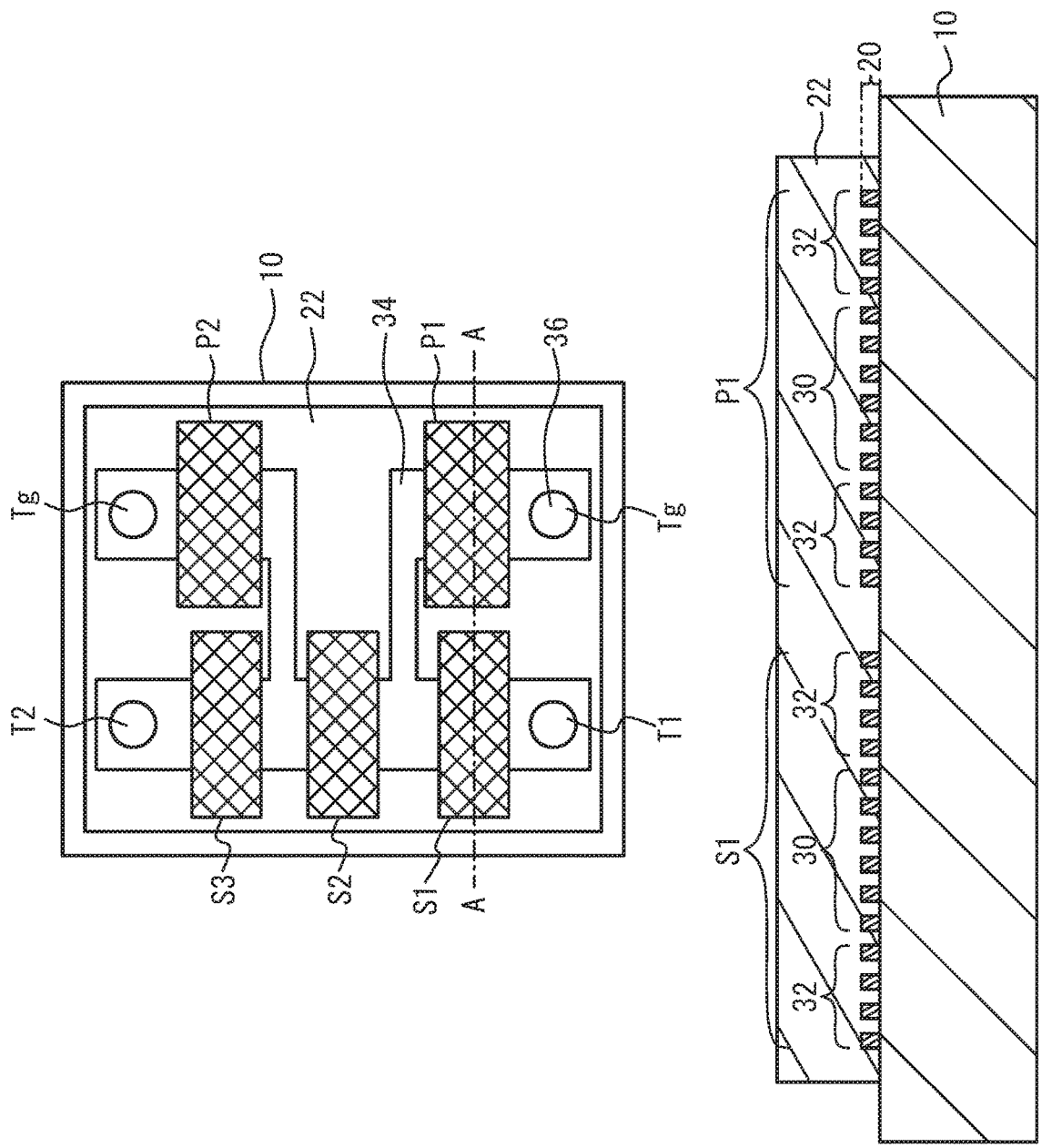
FIG. 13A is a plan view of a filter in accordance with a second embodiment.
FIG. 13B is a cross-sectional view taken along line A-A in FIG. 13A.

A second embodiment is an exemplary filter using the acoustic wave resonator in accordance with the first embodiment. FIG. 13A is a plan view of a filter in accordance with the second embodiment, and FIG. 13B is a cross-sectional view taken along line A-A in FIG. 13A. As illustrated in FIG. 13A and FIG. 13B, the metal film 20 is formed on the piezoelectric substrate 10. The silicon oxide film 22 is formed so as to cover the metal film 20. The metal film 20 forms the IDTs 30 and the reflectors 32. The IDT 30 and the reflectors 32 form an acoustic wave resonator. Formed on the piezoelectric substrate 10 are series resonators S1 through S3, parallel resonators P1 and P2, wiring lines 34, and bumps 36. The bumps 36 function as an input terminal T1, an output terminal T2, and ground terminals Tg. The bump 36 is, for example, a solder bump or a gold bump. The wiring lines 34 electrically connect the acoustic wave resonator to each terminal, and electrically interconnect the acoustic wave resonators. The wiring lines 34 are made of, for example, a metal film such as an Au film, a Cu film, or an Al film. At least one or some of the wiring lines 34 may be formed of the metal film 20. The series resonators S1 through S3 are connected in series between the input terminal T1 and the output terminal T2 through the wiring lines 34. The parallel resonators P1 and P2 are connected in parallel between the input terminal T1 and the output terminal T2 through the wiring lines 34.

At least one of one or more series resonators S1 through S3 and one or more parallel resonators P1 and P2 may be the acoustic wave resonator of the first embodiment. That is, the filter includes the comb-shaped electrodes of the acoustic wave resonator of the first embodiment. Accordingly, a filter having a low-loss and a high performance can be achieved.

The filter includes a plurality of acoustic wave resonators S1 through S3, P1, and P2. The silicon oxide film 22 integrally covers the comb-shaped electrodes included in the acoustic wave resonators. The use of the silicon oxide film 22 used in the first embodiment decreases the variation in the resonance characteristics including a Q-value. The Q-value affects the loss of the filter. Thus, the resonance characteristics of the acoustic wave resonators S1 through S3, P1, and P2 can be made to be uniform. Accordingly, the filter characteristics can be improved.

The first embodiment has described a ladder-type filter as an example. The number of resonators in a ladder-type filter can be appropriately selected. The acoustic wave resonator of the first embodiment may be used for a multimode filter.

Figure 14:
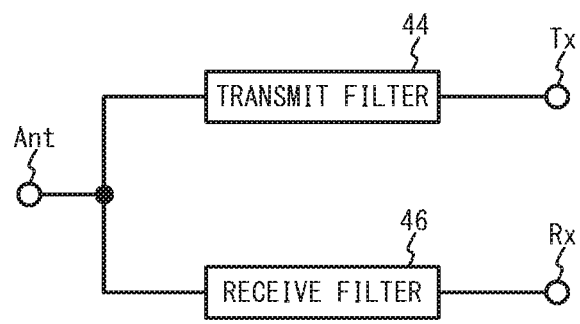
FIG. 14 is a circuit diagram of a duplexer in accordance with a variation of the second embodiment.

FIG. 14 is a circuit diagram of a duplexer in accordance with a variation of the second embodiment. As illustrated in FIG. 14, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 and the receive filter 46 may be the filter of the second embodiment.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric substrate that is a rotated Y-cut X-propagation lithium niobate substrate, a rotated Y-cut angle of the piezoelectric substrate being 120° or greater and 140° or less;
a comb-shaped electrode that is located on the piezoelectric substrate and excites an acoustic wave; and
a silicon oxide film that is located on the piezoelectric substrate so as to cover the comb-shaped electrode, and has a total concentration of carbon (C), hydrogen (H), nitrogen (N), and fluorine (F) equal to or less than 3.5 atomic %, a film thickness of the silicon oxide film on an electrode finger of the comb-shaped electrode being equal to or greater than a film thickness of the electrode finger,
wherein the total concentration of carbon, hydrogen, nitrogen, and fluorine is equal to or greater than 1.5 atomic %.

2. The acoustic wave device according to claim 1, wherein a concentration of argon (Ar) in the silicon oxide film is 0.1 atomic % or less.

3. The acoustic wave device according to claim 2, wherein a concentration of carbon in the silicon oxide film is 1 atomic % or less.

4. The acoustic wave device according to claim 2, wherein a concentration of hydrogen in the silicon oxide film is 2 atomic % or less.

5. The acoustic wave device according to claim 1, wherein the piezoelectric substrate includes, under the comb-shaped electrode, a region in which at least one or some of elements of the comb-shaped electrode are diffused.

6. The acoustic wave device according to claim 5, wherein the comb-shaped electrode includes a Ti film formed on the piezoelectric substrate and a Cu film formed on the Ti film, and
the one or some of elements of the comb-shaped electrode are Ti.

7. The acoustic wave device according to claim 1, further comprising:
a filter including the comb-shaped electrode.

8. The acoustic wave device according to claim 7, wherein the filter includes a plurality of resonators each including the comb-shaped electrode, and
the silicon oxide film integrally covers the comb-shaped electrodes included in the plurality of resonators.

9. The acoustic wave device according to claim 1, further comprising:
a dielectric film that is formed between the piezoelectric substrate and the silicon oxide film so as to cover the comb-shaped electrode.

10. An acoustic wave device comprising:
a piezoelectric substrate that is a rotated Y-cut X-propagation lithium niobate substrate, a rotated Y-cut angle of the piezoelectric substrate being 120° or greater and 140° or less;
a comb-shaped electrode that is located on the piezoelectric substrate and excites an acoustic wave; and
a silicon oxide film that is located on the piezoelectric substrate so as to cover the comb-shaped electrode, and has a total concentration of carbon (C), hydrogen (H), nitrogen (N), and fluorine (F) equal to or less than 3.5 atomic %, a film thickness of the silicon oxide film on an electrode finger of the comb-shaped electrode being equal to or greater than a film thickness of the electrode finger,
wherein:
a concentration of argon (Ar) in the silicon oxide film is equal to or less than 0.1 atomic %,
a concentration of carbon in the silicon oxide film is equal to or greater than 0.3 atomic % and equal to or less than 1 atomic %, and
a concentration of hydrogen in the silicon oxide film is equal to or greater than 1 atomic % and equal to or less than 2 atomic %.

* * * * *